(12) United States Patent
Senzaki

(10) Patent No.: US 9,810,985 B2
(45) Date of Patent: Nov. 7, 2017

(54) METHOD FOR PRODUCING A FIBER HAVING A PATTERN ON THE SURFACE THEREOF

(71) Applicant: TOKYO OHKA KOGYO CO., LTD., Kawasaki-shi (JP)

(72) Inventor: Takahiro Senzaki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/167,039

(22) Filed: May 27, 2016

(65) Prior Publication Data
US 2016/0355952 A1 Dec. 8, 2016

(30) Foreign Application Priority Data
Jun. 4, 2015 (JP) .................. 2015-113712

(51) Int. Cl.
| | | |
|---|---|---|
| G03F 7/004 | (2006.01) | |
| G03F 7/40 | (2006.01) | |
| G03F 7/16 | (2006.01) | |
| G03F 7/20 | (2006.01) | |
| G03F 7/32 | (2006.01) | |
| B82Y 40/00 | (2011.01) | |
| G03F 7/00 | (2006.01) | |
| B82Y 10/00 | (2011.01) | |
| D01D 5/253 | (2006.01) | |

(52) U.S. Cl.
CPC ............... *G03F 7/16* (2013.01); *B82Y 10/00* (2013.01); *B82Y 40/00* (2013.01); *D01D 5/253* (2013.01); *G03F 7/002* (2013.01); *G03F 7/161* (2013.01); *G03F 7/20* (2013.01); *G03F 7/32* (2013.01)

(58) Field of Classification Search
CPC ... G03F 7/002; G03F 7/20; G03F 7/32; G03F 7/16; G03F 7/161; B82Y 10/00; B82Y 40/00
USPC ............. 430/270.1, 311, 322, 331, 5, 306, 9
See application file for complete search history.

(56) References Cited

U.S. PATENT DOCUMENTS

| | | | | |
|---|---|---|---|---|
| 6,881,529 B2 * | 4/2005 | Iwasaki | ................. | G03F 7/0233 430/166 |
| 7,105,221 B2 * | 9/2006 | Akamatsu | ............. | H05K 3/007 174/254 |
| 7,781,047 B2 * | 8/2010 | Majumdar | ............. | H01B 1/122 252/500 |
| 7,829,180 B2 * | 11/2010 | Ushiki | ................ | B32B 37/1292 156/272.2 |

(Continued)

FOREIGN PATENT DOCUMENTS

JP 2001-164428 6/2001

*Primary Examiner* — Amanda C Walke
(74) *Attorney, Agent, or Firm* — Knobbe Martens Olson & Bear LLP

(57) ABSTRACT

A method for producing a fiber having a pattern on a surface thereof. The fiber is produced by a method including forming a photosensitive composition layer on a template layer having a pattern, bonding a film including an adhesive layer on a principal plane onto the photosensitive composition layer, linearly exposing the photosensitive composition layer to light, separating an exposed laminate comprising the photosensitive composition layer, the adhesive layer, and the film from the template layer, and developing the photosensitive composition layer in the separated laminate.

9 Claims, 2 Drawing Sheets

(56) References Cited

U.S. PATENT DOCUMENTS

| | | | |
|---|---|---|---|
| 8,053,164 B2 * | 11/2011 | Kim | B82Y 10/00 |
| | | | 430/270.1 |
| 8,293,453 B2 * | 10/2012 | Kawamori | C09J 179/08 |
| | | | 430/270.1 |
| 8,438,726 B2 * | 5/2013 | Inoue | H05K 3/20 |
| | | | 174/250 |
| 8,551,685 B2 * | 10/2013 | Morita | B82Y 10/00 |
| | | | 430/270.1 |
| 9,541,826 B2 * | 1/2017 | Ito | C09D 4/00 |

* cited by examiner

METHOD FOR PRODUCING A FIBER HAVING A PATTERN ON THE SURFACE THEREOF

This application claims priority TO Japanese Patent Application No. 2015-113712, filed Jun. 4, 2015, the content of which is incorporated herein by reference.

BACKGROUND OF THE INVENTION

Field of the Invention

This application is based on and claims the benefit of priority from Japanese Patent Application No. 2015-113712, filed on 4 Jun. 2015, the content of which is incorporated herein by reference.

Related Art

Studies on providing of concaves and convexes on the surface of a fiber have hitherto been made for attaining various purposes such as an improvement in touch feeling and texture. For example, Patent Document 1 proposes a method for producing a composite fiber having concaves and convexes on a surface thereof, the method comprises subjecting a polyester composition containing 20 to 50% by mass of a poly(meth)acrylate resin and a polyester free from a poly(meth)acrylate resin to composite spinning, taking off an unstretched yarn at a speed of not more than 3500 m/min; and then stretching the unstretched yarn at a stretching temperature of 55 to 95° C. by a factor of 0.62 to 0.91 of the maximum stretch ratio.

On the other hand, nano fibers having a thickness on a nanometer order have drawn attention, for example, from the viewpoints of a high absorptive property derived from a large surface area, a reduction in pressure loss by the production of a slip stream in use in filters, excellent optical properties that can easily provide fabrics having a high level of transparency, and excellent electrical properties, dynamic properties, and thermal properties by virtue of a supermolecule alignment effect.

Patent Document 1: Japanese Unexamined Patent Application, Publication No. 2001-164428

SUMMARY OF THE INVENTION

If concaves and convexes can be provided also on the surface of nanofibers, a higher level of function can be expected, for example, by an increased surface area. However, satisfactory studies have not been made on a method for providing concaves and convexes on the surface of nanofibers.

The shape of concaves and convexes provided to the surface of the fiber is preferably regular and has a uniform size from the viewpoint of a small variation in properties of fibers. Even though conventional methods such as a method described in Patent Document 1 can be applied to nanofibers, difficulties are encountered in providing a shape of concaves and convexes that is regular and has a uniform size, on the surface of nanofibers.

The present invention has been made in view of the above problems, and an object of the present invention is to provide a method for producing a fiber having a pattern on a surface thereof, wherein the fiber is an ultrafine fiber with a thickness on a nanometer scale to a thickness of several microns, and a concavo-convex shape can be provided regularly in a uniform size onto the surface thereof.

The present inventors have found that the above problems can be solved by a method for producing a fiber including forming a photosensitive composition layer on a template layer having a pattern on a surface thereof, bonding a film comprising an adhesive layer on a principal plane onto the photosensitive composition layer, linearly exposing the photosensitive composition layer to light, separating exposed laminate comprising the photosensitive composition layer, the adhesive layer, and the film from the template layer, and developing the photosensitive composition layer in the separated laminate.

According to a first aspect of the present invention, there is provided a method for producing a fiber having a pattern on a surface thereof, the method comprising:

forming a photosensitive composition layer on a template layer having a pattern by using a photosensitive composition;

bonding a film comprising an adhesive layer on a principal plane onto the photosensitive composition layer via the adhesive layer;

linearly exposing the photosensitive composition layer to light;

separating exposed laminate comprising the photosensitive composition layer, the adhesive layer, and the film from the template layer; and developing the photosensitive composition layer in the separated laminate.

According to a second aspect of the present invention, there is provided a fiber having a pattern on a surface thereof, the fiber being produced by the method according to the first aspect.

The present invention can provide a method for producing a fiber having a pattern on a surface thereof, wherein the fiber is an ultrafine fiber with a thickness on a nanometer scale to a thickness of several microns, and a concavo-convex shape can be provided regularly in a uniform size onto the surface thereof.

DETAILED DESCRIPTION OF THE INVENTION

<<Method for Producing Fiber>>

In the method for producing a fiber according to the present invention, a fiber having a pattern on a surface thereof is produced. The method for producing a fiber according to the present invention comprises the steps of:

forming a photosensitive composition layer on a template layer having a pattern by using a photosensitive composition;

bonding a film comprising an adhesive layer on a principal plane onto the photosensitive composition layer via the adhesive layer;

linearly exposing the photosensitive composition layer to light;

separating exposed laminate comprising the photosensitive composition layer, the adhesive layer, and the film from the template layer; and developing the photosensitive composition layer in the separated laminate.

In the following detailed description of the present invention, the step of forming a photosensitive composition layer by using a photosensitive composition on a template layer having a pattern is referred to as a first step, the step of bonding a film comprising an adhesive layer on a principal plane onto the photosensitive composition layer via the adhesive layer is referred to as a second step, the step of linearly exposing the photosensitive composition layer to light is referred to as a third step, the step of separating the exposed laminate comprising the photosensitive composition layer, the adhesive layer, and the film from the template layer is referred to as a fourth step, and the step of developing the photosensitive composition layer in the separated laminate is referred to as a fifth step.

Essential or optional steps comprised in the method for producing a fiber according to the present invention are described hereinafter.

First Step

Figure 1A:
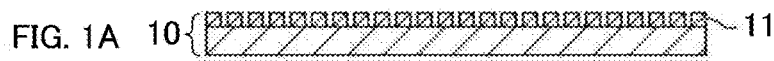
FIG. 1A is a schematic cross-sectional view of a substrate with a template layer.
Figure 1B:
FIG. 1B is a schematic view of a photosensitive resin layer formed on the template layer on the substrate.

In the first step, as illustrated in FIGS. 1A and 1B, a photosensitive composition layer 12 is formed on a template layer 11 having a pattern by using a photosensitive composition.

The template layer 11 may be provided integrally with a substrate 10 in a seamless manner or alternatively may be stacked on the substrate 10. The method for the formation of the template layer 11 is not particularly limited. Methods for the formation of the template layer 11 include, but are not limited thereto, the following methods.

(1) A method of applying a photosensitive composition onto a substrate 10 to form a coating film that is processed by photolithography to obtain a patterned template layer 11.

(2) A photoimprinting method of applying a photosensitive composition onto a substrate 10 to form a coating film, pressing a pressing mold having a shape corresponding to a pattern shape of the template layer 11 against the coating film, followed by exposing the coating film pressed by the pressing mold to light to cure the coating film and thus to obtain the template layer 11.

(3) A thermal imprinting method of forming a thin film of a material having a glass transition temperature on a substrate 10, pressing a pressing mold having a shape corresponding to a pattern shape of a template layer 11 against the thin film in such a state that the formed thin film has been heated at or above the glass transition temperature, thereby deforming the thin film, followed by cooling the deformed thin film to obtain the template layer.

(4) A method of forming an etching mask having a shape corresponding to a pattern shape of a template layer 11 on a substrate 10, followed by engraving a pattern on the surface of the substrate 10 by etching to obtain a substrate 10 having a patterned surface as a template layer 11.

(5) A method of forming a thin film of a block copolymer composed of at least two block chains different from each other in surface free energy on a substrate 10, and obtaining a patterned template layer 11 by self-organizing lithography in which the block copolymer is subjected to microphase separation.

In the thermal imprinting method employed in the method (3), materials usable for the thin film formation include, for example, (meth)acrylic resins typified by polymethyl methacrylate (PMMA), polycarbonate resins, polystyrenes, polyester resins such as polyethylene terephthalate, and thermoplastic resins such as cycloolefin resins. As the self-organizing lithography employed in the method (4), for example, methods described in Japanese Unexamined Patent Application, Publication No. 2008-036491 and Japanese Unexamined Patent Application, Publication No. 2014-099568 can be employed.

As described above, various materials are usable as materials for the template layer 11. A photosensitive composition is preferably used as the material for the template layer 11, since a template layer 11 having a pattern in a precisely controlled shape can easily be formed.

Photosensitive compositions are classified into positive-type photosensitive compositions that allow exposed areas to be solubilized with respect to developing solutions and negative-type photosensitive compositions that allow exposed areas to be insolubilized with respect to developing solutions. Both types can be used in the formation of the template layer 11. Negative-type photosensitive compositions that are cured under exposure are preferred from the viewpoints of easy formation of the template layer 11 having excellent solvent resistance and easy formation of the template layer 11 having a fine pattern.

The material for the substrate 10 is not particularly limited and may be appropriately selected according to the method for the formation of the template layer 11. Materials for the substrate 10 include inorganic materials such as silicon and glass, and organic materials such as resins, for example, polyethylene terephthalate.

The pattern shape of the template layer 11 is not particularly limited and may be appropriately selected according to the purpose of providing a pattern. The pattern shape may be either regular or irregular. Preferably, the pattern shape is regular since a variation in properties between a plurality of fibers 17 is small.

Typical examples of the pattern shape of the template layer 11 include a line-and-space pattern, a dot pattern, and a hole pattern. In the case of the pattern of the template layer 11 being the line-and-space pattern, a line-and-space pattern composed of spaces having a shape corresponding to the shape of lines (convexes) in the template layer 11 and lines having a shape corresponding to spaces (concaves) in the template layer 11 are formed on the surface of the fiber 17. In the case of the pattern of the template layer 11 being the dot pattern, concaves having a shape corresponding to the shape of dots (convexes) in the template layer 11 are regularly formed on the surface of the fiber 17. In the case of the pattern of the template layer 11 being the hole pattern, convexes having a shape corresponding to the shape of holes (concaves) in the template layer 11 are regularly formed on the surface of the fiber 17.

In the case of the pattern of the template layer 11 being the line-and-space pattern, the direction of the line-and-space pattern formed on the surface of the fiber 17 may be horizontal to, or perpendicular to, or oblique to the longitudinal direction of the fiber.

In the case of the pattern of the template layer 11 being the line-and-space pattern, the pattern may include a plurality of types of lines different from each other in width or height, or alternatively may include a plurality of types of spaces different from each other in width or depth.

In the case of the pattern of the template layer 11 being the dot pattern, the shape of dots is not particularly limited. Preferable examples of the dot shape include a cylindrical shape, an elliptic cylindrical shape, a polygonal columnar shape such as a triangular prism shape, a quadrangular prism shape, a pentagonal prism shape, and a hexagonal prism shape, a truncated conical shape, and a truncated elliptical shape, and a truncated polygonal shape. A preferred shape of the apex of dots includes a circular shape, an elliptical shape, or a regular polygonal shape such as a regular triangular shape, a square shape, a regular pentagonal shape, and a regular hexagonal shape. In the case of the pattern of the template layer 11 being the dot pattern, the pattern may include two or more types of dots different from each other in shape or dimension.

In the case of the pattern of the template layer 11 being the hole pattern, the shape of the hole is not particularly limited. A preferred shape of the hole includes shapes formed by removing, from the template layer 11 with no pattern formed, a polygonal shape such as a cylindrical shape, an elliptical columnar shape, a triangular prism shape, a quadrangular prism shape, and a pentagonal prism shape, a truncated conical shape, a truncated elliptical shape, a truncated polygonal shape, and the like. A preferred shape of opening of the hole includes a circular shape, an elliptical shape, or a regular polygonal shape such as a regular triangular shape, a square shape, a regular pentagonal shape, and a regular hexagonal shape. In the case of the pattern of the template layer 11 being the hole pattern, the pattern may include two or more holes different from each other in shape or dimension.

The size of the pattern of the template layer 11 is not particularly limited and may be appropriately determined, for example, in the light of the dimension of the fiber 17 to be finally formed and the surface area of the fiber 17. For example, in the case of the pattern of the template layer 11 being the line-and-space pattern, the width of lines and the width of spaces are preferably 10 to 10000 nm, more preferably 10 to 5000 nm. The height of lines (depth of spaces) is preferably 10 to 10000 nm, more preferably 10 to 5000 nm. In the case of the pattern of the template layer 11 being the hole pattern having circular openings, the diameter of an opening of the hole is preferably 10 to 10000 nm, more preferably 10 to 5000 nm, and the depth of the hole is preferably 10 to 10000 nm, more preferably 10 to 5000 nm. In the case of the pattern of the template layer 11 being the dot pattern having a cylindrical shape, the diameter of a dot is preferably 10 to 10000 nm, more preferably 10 to 5000 nm, and the height of the dot is preferably 10 to 10000 nm, more preferably 10 to 5000 nm.

A photosensitive composition layer 12 is formed by using a photosensitive composition on a template layer 11 of the substrate 10 with the template layer 11 formed thereon by the above method. Here the photosensitive composition layer 12 is formed so that the photosensitive composition is filled into concaves in the pattern of the template layer 11.

Photosensitive compositions are classified into positive-type photosensitive compositions that allow exposed areas to be solubilized with respect to developing solutions and negative-type photosensitive compositions that allow exposed areas to be insolubilized with respect to developing solutions. Both types can be used in the formation of the photosensitive composition layer 12. Negative-type photosensitive compositions that are cured under exposure are preferred since fibers 17 having excellent strength can be formed.

Preferred examples of suitable photosensitive compositions include compositions comprising an epoxy group-containing epoxy compound and a photosensitive curing agent, compositions comprising an alkali-soluble resin, a photopolymerizable compound containing an unsaturated double bond, and a photopolymerization agent, and compositions comprising an alkali-soluble resin such as polyhydroxystyrene (PHS), a crosslinking agent, and a photo acid generating agent. Among the above photosensitive compositions, compositions comprising an epoxy group-containing epoxy compound and a photosensitive curing agent and compositions comprising an alkali-soluble resin, a crosslinking agent, and a photo acid generating agent are preferred from the viewpoint of the strength of the formed fiber 17.

A method of applying a liquid photosensitive composition onto the surface of the template layer 11 may be mentioned as a preferred method for the formation of a photosensitive composition layer 12 on the template layer 11. Methods for applying a liquid photosensitive composition onto a surface of a template layer 11 include, for example, methods using contact transfer-type coaters such as roll coaters, reverse coaters, and bar coaters and noncontact-type coaters such as spinners (rotary coaters) and curtain flow coaters. A photosensitive composition layer 12 is formed by, if necessary, drying a coating film formed after application, for example, by heating.

The thickness of the photosensitive composition layer 12 is not particularly limited and may be appropriately determined according to the thickness of the fiber 17 to be formed. The thickness of the photosensitive composition layer 12 is, for example, preferably 100 nm to 1000 μm, and more preferably 1 μm to 500 μm.

Alternatively, the photosensitive composition layer 12 may be formed on the template layer 11 by using a dry film of a photosensitive composition comprising a photosensitive composition layer 12 stacked via an adhesive layer 14 on a film 13 with an adhesive layer provided on a principal plane 13a thereof. In this case, a photosensitive composition layer 12 can be formed on a template layer 11 by pressing a template layer 11 against the surface of the photosensitive composition layer 12 in the dry film so that the photosensitive composition is filled into concaves of the pattern of the template layer 11. This method includes a first step and a second step.

In this method, if necessary, the template layer 11 and/or the dry film may be softened by heating from the viewpoint of easy filling of the photosensitive composition into concaves in the pattern of the template layer 11.

Second Step

Figure 1C:
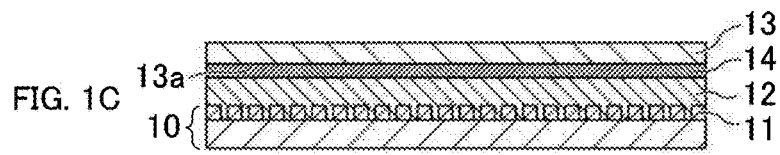
FIG. 1C is a schematic view of a film being layered, via an adhesive layer, on a surface of the photosensitive resin layer formed on the template layer on the substrate.

In the second step, as illustrated in FIG. 1C, the film 13 having the adhesive layer 14 on the principal plane 13a thereof is bonded onto the photosensitive composition layer 12 formed in the first step via the adhesive layer 14.

The material for the film 13 is not particularly limited as long as the material has a strength high enough to support the photosensitive composition layer 12 while maintaining the form of the layer 12 during separation of the photosensitive composition layer 12 from the substrate 10 in the fourth step, which will be described later.

The material for the film 13 may be either an inorganic material or an organic material. The material for the film 13 is preferably an organic material such as resins, since, with the film 13 being highly flexible, cracking or breaking of the laminate derived from curving of the laminate is less likely during separation of the laminate including the film 13 from the substrate 10 in the fourth step which will be described later.

The film 13 may be either a monolayered film or a multilayered laminated film. In the case of the film 13 being the multilayered laminated film, materials of a plurality of layers included in the film 13 may be either the same or different from each other.

Specific examples of organic materials suitable for use as the material for the film 13 include polymeric materials such as polyacetals, polyamides, polycarbonates, polyesters (for example, polybutylene terephthalate, polyethylene terephthalate, polyarylate), FR-AS resins, FR-ABS resins, AS resins, ABS resins, polyphenylene oxides, polyphenylene sulfides, polysulfones, polyethersulfones, polyether ether ketone, fluororesins, polyimides, polyamide-imides, polyamide-bismaleimides, polyetherimides, silicone resins, BT resins, polymethylpentenes, ultrahigh-molecular polyethylenes, FR-polypropylenes, (meth)acrylic resins (for example, polymethyl methacrylate), polystyrenes, novolak resins, and derivatives thereof. Among them, from the viewpoint of inexpensiveness, easy availability, as well as excellent transparency, chemical resistance, mechanical strength and other properties, polycarbonates, polyesters, (meth)acrylic resins (for example, polymethyl methacrylates), and polystyrenes are preferred, and polyesters are more preferred.

In a case in which both the substrate 10 and the template layer 11 are formed of a translucent material, in the third step which will be described later, the photosensitive composition layer 12 may be exposed from a surface remote from the template layer 11 in the substrate 10. In this case, the material for the film 13 is not necessarily a material that is translucent.

The adhesive layer 14 is formed on the main plane 13a of the film 13, which has been described above. The method for the formation of the adhesive layer 14 is not particularly limited, and examples thereof include a method of applying a liquid adhesive and a method of laminating an adhesive sheet on the main plane 13a of the film 13.

As the method of applying the liquid adhesive onto the film 13, the method in the first step of applying the photosensitive composition onto the template layer 11 may be mentioned.

The type of the adhesive used in the formation of the adhesive layer 14 is not particularly limited as long as the fiber 17 can be separated. A liquid adhesive prepared by dissolving an adhesive main agent, which is soluble in a solvent, in a solvent is suitable as the adhesive. When such adhesives are used, the fiber 17 can easily be released from the film 13 by dissolving the adhesive layer 14 in a solvent that can dissolve the adhesive layer 14 after the formation of the fiber 17 in the fifth step.

Examples of main agents of the adhesive include polyvinyl alcohol resins, dextrins, gelatins, glues, caseins, shellacs, gum arabics, starches, proteins, polyacrylic acid amides, sodium polyacrylates, polyvinyl methyl ethers, styrenic elastomers, copolymers of methyl vinyl ether with maleic anhydride, copolymers of vinyl acetate with itaconic acid, polyvinyl pyrrolidones, acetylcelluloses, hydroxyethylcelluloses, and sodium alginate. These materials may be a combination of a plurality of materials soluble in an identical liquid. The adhesive may contain a rubber component such as mannan, xanthan gum, and guar gum from the viewpoints of strength and flexibility of the adhesive layer 14.

A coating liquid for the formation of the adhesive layer 14 is prepared by dissolving the above-described main agent of the adhesive in a liquid in which the adhesive is soluble. The liquid for dissolving the main agent of the adhesive can be any liquid that neither deteriorates nor dissolves the formed fiber 17, with no particular limitation. Examples of the liquid for dissolving the main agent of the adhesive include water, acidic or basic aqueous solutions, organic solvents, and aqueous solutions of organic solvents. Among them, water, acidic or basic aqueous solutions, and aqueous solutions of organic solvents are preferred.

Preferred examples of the liquid that dissolves the main agent of the adhesive include an organic solvent. Organic solvents include lactone, ketone, polyhydric alcohol, cyclic ether, and ester organic solvents, aromatic organic solvents, alcohol solvents, terpene solvents, hydrocarbon solvents, and petroleum solvents. These organic solvents may be used solely or in a combination of a plurality of types thereof.

Lactone organic solvents include, for example, γ-butyrolactone, examples of ketone organic solvents include acetone, methyl ethyl ketone, cycloheptanone, cyclohexanone, methyl-n-pentyl ketone, methyl isopentyl ketone, or 2-heptanone, and examples of polyhydric alcohol organic solvents include ethylene glycol, diethylene glycol, propylene glycol, or dipropylene glycol.

The polyhydric alcohol organic solvent may be a polyhydric alcohol derivative, and examples thereof include compounds containing an ester bond (for example, ethylene glycol monoacetate, diethylene glycol monoacetate, propylene glycol monoacetate, or dipropylene glycol monoacetate), or compounds containing an ether bond (for example, monoalkyl ethers such as monomethyl ether, monoethyl ether, monopropyl ether, or monobutyl ether, or mono phenyl ethers of the above polyhydric alcohols or the above ester bond-containing compounds, and the like). Among them, propylene glycol monomethyl ether acetate (PG-MEA), and propylene glycol monomethyl ether (PGME) are preferred.

Cyclic ether organic solvents include, for example, dioxane, and examples of ester organic solvents include methyl lactate, ethyl lactate (EL), methyl acetate, ethyl acetate, butyl acetate, methyl pyruvate, ethyl pyruvate, methyl methoxypropionate, or ethyl ethoxypropionate.

Aromatic organic solvents include, for example, anisole, ethyl benzyl ether, cresyl methyl ether, diphenyl ether, dibenzyl ether, phenetol, butyl phenyl ether, ethylbenzene, diethylbenzene, pentylbenzene, isopropylbenzene, toluene, xylene, cymene, or mesitylene.

The alcohol solvent is not particularly limited as long as the solvent can dissolve the main agent of the adhesive. Examples thereof include methanol and ethanol.

Terpene solvents include, for example, include geraniol, nerol, linalool, citral, citronellol, menthol, isomenthol, neomenthol, α-terpineol, β-terpineol, γ-terpineol, terpinen-1-ol, terpinen-4-ol, dihydroterpinyl acetate, 1,4-cineol, 1,8-cineol, borneol, carvone, ionone, thujone, and camphor.

Hydrocarbon solvents include straight chain, branched chain, or cyclic hydrocarbons. Such hydrocarbon solvents include, for example, straight chain hydrocarbons having 3 to 15 carbon atoms such as hexane, heptane, octane, nonane, decane, undecane, dodecane, and tridecane; branched hydrocarbons having 4 to 15 carbon atoms such as methyloctane; and cyclic hydrocarbons such as p-menthane, o-menthane, m-menthane, diphenylmenthane, 1,4-terpin, 1,8-terpin, bornane, norbornane, pinane, thujane, carane, longifolene, α-terpinene, β-terpinene, γ-terpinene, α-pinene, β-pinene, α-thujone, and β-thujone.

Petroleum solvents include, for example, cyclohexane, cycloheptane, cyclooctane, naphthalene, decahydronaphthalene (decalin), and tetrahydronaphthalene (tetralin).

The coating liquid for the formation of the adhesive layer 14 is prepared by homogeneously dissolving the main agent of the adhesive and the solvent as described above. The concentration of the coating liquid may be appropriately determined by taking into consideration the coatability of the coating liquid and the tackiness of the adhesive layer.

Following the formation of the adhesive layer 14, the solvent may, if necessary, be removed from the adhesive layer. The tackiness of the adhesive layer 14 can be adjusted by regulating the content of the solvent in the adhesive layer 14.

The adhesive layer 14 may be formed by using a photocurable adhesive or a heat-curable adhesive. A composition comprising a polymerizable compound containing an ethylenically unsaturated double bond such as a polyfunctional (meth)acrylate compound and a photopolymerization agent may be mentioned as a preferred example of a suitable photocurable adhesive. A composition comprising a monofunctional or polyfunctional epoxy compound and a curing agent may be mentioned as a preferred example of a suitable heat-curable adhesive.

The thickness of the adhesive layer 14 is not particularly limited but is preferably 0.1 to 100 μm, more preferably 0.5 to 50 μm, particularly preferably 0.5 to 10 μm, from the viewpoint of rapidly dissolving the adhesive layer 14 in the solvent.

Third Step

Figure 1D:
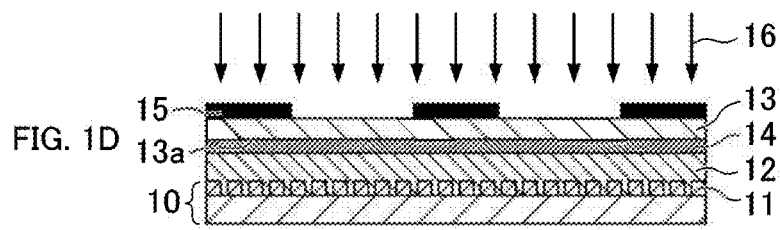
FIG. 1D is a schematic view illustrating position-selective exposure through a photomask, targeted at the photosensitive resin layer included in a laminate comprising: the photosensitive resin layer; the adhesive layer; and the film, the laminate being formed on the template layer on the substrate.

In the third step, as illustrated in FIG. 1D, a photosensitive composition layer 12 is linearly exposed. Here the "linearly" may be a straight or curved form. Linear exposed areas and linear unexposed areas are formed in the photosensitive composition layer 12 by such exposure. Any method for linear exposure may be carried out without particular limitation. A method is preferred in which an exposure light 16 is applied to the photosensitive composition layer 12 through a photomask 15 designed to fit on the shape of a desired fiber.

In the case of the photosensitive composition layer 12 being a negative-type photosensitive composition that is curable by exposure, exposed areas become fibers 17 while unexposed areas are removed by development. In the case of the photosensitive composition layer 12 being a positive-type photosensitive composition that is solubilized with respect to a developing solution by exposure, exposed areas are removed by development while unexposed areas become fibers 17. FIGS. 1D to 1H are schematic views of a preferred embodiment using a negative-type photosensitive composition.

In the case of the substrate 10 being formed of a transparent material such as a glass substrate, exposure of the photosensitive composition layer 12 may be carried out from a surface remote from the template layer 11 in the substrate 10.

In the linear exposure, the width of lines corresponding to the fibers 17 is not particularly limited but is preferably 100 nm to 1000 μm, more preferably 1 μm to 500 μm. The line width corresponds to the thickness of the fiber 17 in the direction of a surface of the photosensitive composition layer 12.

Fourth Step

Figure 1E:
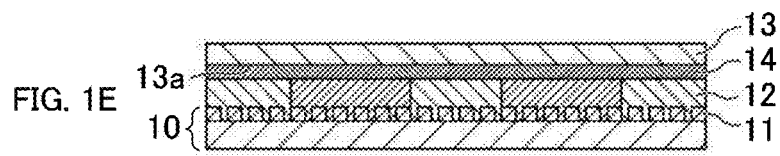
FIG. 1E is a schematic view of a fiber (an exposed area) and an unexposed area formed in the photosensitive resin layer included in the laminate comprising: the photosensitive resin layer; the adhesive layer; and the film, the laminate being formed on the template layer on the substrate.
Figure 1F:
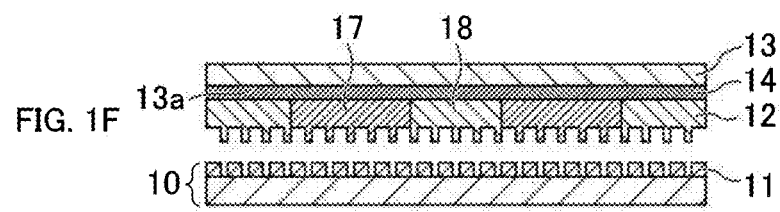
FIG. 1F is a schematic view of the laminate comprising: the photosensitive resin layer including the fiber (the exposed area) and the unexposed area; the adhesive layer; and the film, the laminate having been separated from the substrate with the template layer.

In the fourth step, as illustrated in FIGS. 1E and 1F, a laminate comprising a film 13 and a photosensitive composition layer 12 including fibers 17 exposed in the third step and unexposed areas 18 and, the photosensitive composition layer 12 including fibers 17 and unexposed areas 18 being stacked on the film 13 via an adhesive layer 14, is separated from a substrate 10.

The laminate can be separated from the substrate 10 by any method without particular limitation. For example, while holding the laminate, an external force can be applied in such a direction that the laminate is separated.

Fifth Step

Figure 1G:
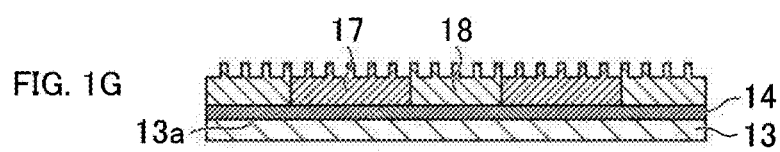
FIG. 1G is a schematic cross-sectional view of the laminate comprising: the photosensitive resin layer including the fiber (the exposed area) and the unexposed area; the adhesive layer; and the film.
Figure 1H:
FIG. 1H is a schematic view of unexposed areas having been removed from the laminate, the laminate comprising: the photosensitive resin layer including the fiber (the exposed area) and the unexposed area; the adhesive layer; and the film.

In the fifth step, the photosensitive composition layer 12 in the laminate separated from the substrate 10 in the fourth step is developed. As illustrated in FIGS. 1G and 1H, the photosensitive composition layer 12 including the fibers 17 exposed in the third step and unexposed areas 18 are brought into contact with a developing solution (not shown) to dissolve the unexposed areas 18 in the photosensitive composition layer 12 and thus to form linear fibers 17. Thus, the fibers 17 formed on the adhesive layer 14 have on the surface thereof a fine pattern corresponding to the shape of the template layer 11.

The developing solution may be appropriately selected according to the type of the photosensitive composition. Typically, a developing solution composed of an organic solvent and an alkaline developing solution are preferred.

Organic solvents used as the developing solution include a polar solvent such as a ketone solvent, an ester solvent, an ether solvent, and an amide solvent, as well as a hydrocarbon solvent.

Alkaline developing solutions include, for example, aqueous solution of alkalis such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, and 1,5-diazabicyclo[4,3,0]-5-nonane. An aqueous solution prepared by adding a suitable amount of a water-soluble organic solvent such as methanol or ethanol or a surfactant to the aqueous solution of the alkalis may also be used as the alkaline developing solution.

A developing time varies according to the composition of the photosensitive composition layer 12, the thickness, and the like; however is generally 1 to 30 min. Any development method may be selected from publicly known methods, and any of a filling-up method, a dipping method, a paddle method, and a spray development method may be used.

The fibers 17 that are supported on the film 13 via the adhesive layer 14 and have been formed through the fifth step are, if necessary, separated from the film 13 and used in various applications.

Sixth Step

Figure 1I:
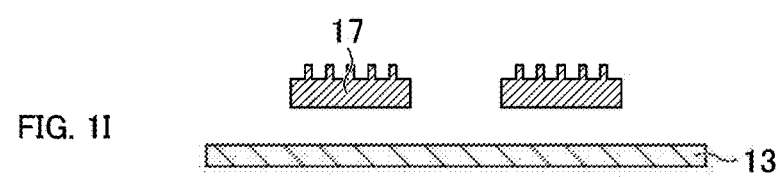
FIG. 1I is a schematic view of the fiber (the exposed area) separated from the film by removing the adhesive layer from the laminate, the laminate comprising: the fiber (the exposed area); the adhesive layer; and the film.

In the sixth step, as illustrated in FIGS. 1H and 1I, the fibers 17 supported on the film 13 via the adhesive layer 14 are separated from the film 13. A preferred method for the sixth step is to bring a solvent (not shown), which can dissolve the adhesive, into contact with the adhesive layer 14. Solvents described above and usable in the preparation of coating liquids for adhesive layer formation may be mentioned as the solvent usable in the dissolution of the adhesive layer 14 to dissolve the adhesive layer 14.

Any method in which the adhesive layer 14 is brought into contact with the solvent to dissolve the adhesive layer is not particularly limited. Preferably, a method in which a film 13 including a fiber 17 and an adhesive layer 14 is immersed in a solvent filled into a container.

According to the method described above, fibers having a thickness from nanometer scale to several micrometers can be manufactured, and, even when the thickness of the fibers is from a nanometer scale to several micrometers, concave-convex shapes that are regular and have a uniform size can be provided on the surface of the fibers. Fibers having a pattern on the surface thereof and produced by the above methods have a larger surface area than fibers free from a pattern on the surface thereof, and thus, high adsorptivity can be expected for nonwoven fabrics and the like produced therewith. Furthermore, since the surface area is large, for example, when treating the surface of the fibers with a treatment solution containing a chemical agent such as an antimicrobial agent, a larger amount of a chemical agent can be held on the surface of the fibers.

EXAMPLES

The following Examples further illustrate the present invention, though the present invention is not limited thereto.

Example 1

A silicon substrate comprising a template layer having a pattern of dots having a diameter of 300 nm and a height of 100 nm and regularly arranged with a distance between dot centers being 600 nm and an antireflection film ARC-29A was used. A template layer was formed by ArF lithography with Nikon S308F (manufactured by NIKON CORPORATION).

A photosensitive composition comprising 50 parts by mass of EBECRYL80 (manufactured by DAICEL-ALLNEX LTD.), 50 parts by mass of M-309 (manufactured by TOAGOSEI CO., LTD.), and 3 parts by mass of DETX (manufacture by Ciba Japan K.K.) was coated on a surface of the template layer to a thickness of 20 μm to form a photosensitive composition layer. Subsequently, a polyethylene terephthalate film (thickness 100 μm) comprising a 3 μm-thick adhesive layer formed of 100 parts by mass of M-313 (manufactured by TOAGOSEI CO., LTD.) and 3 parts by mass of IR-907 (manufactured by Ciba Japan K.K.) was laminated so that the adhesive layer was brought into contact with the photosensitive composition layer.

Subsequently, a photomask having a line-and-space pattern was placed on the polyethylene terephthalate film, and the photosensitive composition layer was exposed so that fibers having a width of 40 μm in the direction of the surface of the substrate are formed. The exposure was carried out with HMW-532D (manufactured by ORC) at an exposure of 20 mJ/cm$^2$.

A polyethylene terephthalate film comprising an exposed photosensitive composition layer and an adhesive layer was separated from the substrate. Thereafter, the photosensitive composition layer was subjected to dip development with propylene glycol monomethyl ether acetate as a developing solution to form fibers on the polyethylene terephthalate film.

Subsequently, the polyethylene terephthalate film comprising fibers and an adhesive layer was recovered with a pair of tweezers, followed by drying to obtain fibers having a hole pattern on the surface thereof.

Figure 2:
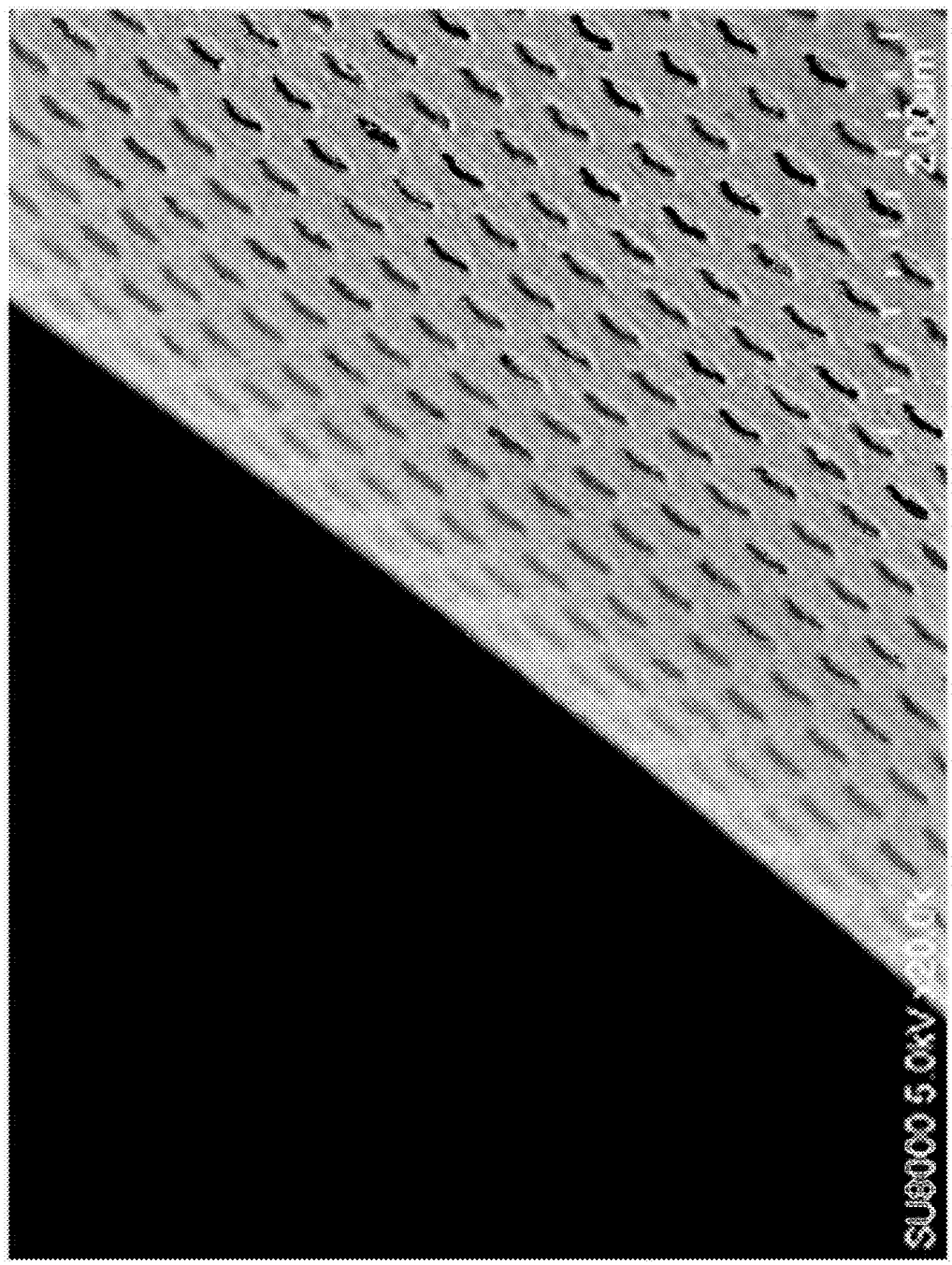
FIG. 2 is a photomicrograph showing a patterned surface of the fiber obtained in Example 1, observed at a magnification of 20000 times.

The surface of the fiber thus obtained was observed by a microscope at a magnification of 20,000 times, and was confirmed to have circular openings having a diameter of 300 nm and a plurality of holes having a depth of 100 nm being regularly present. A photomicrograph (magnification 20,000 times) of a surface having a pattern in the fiber thus obtained is shown in FIG. 2.

EXPLANATION OF REFERENCE NUMERALS

10 Substrate
11 Template layer
12 Photosensitive composition layer
13 Film
13a Principal plane of film
14 Adhesive layer
15 Photomask
16 Exposure light
17 Fiber
18 Unexposed area

What is claimed is:

1. A method for producing a fiber having a pattern on a surface thereof, the method comprising:
   forming a photosensitive composition layer on a patterned template layer using a photosensitive composition;
   bonding a film comprising an adhesive layer on a principal plane onto the photosensitive composition layer via the adhesive layer;
   linearly exposing the photosensitive composition layer to light;
   separating exposed laminate comprising the photosensitive composition layer, the adhesive layer, and the film from the patterned template layer; and
   developing the photosensitive composition layer in the separated laminate.

2. The method according to claim 1, wherein the photosensitive composition is a negative-type photosensitive composition.

3. The method according to claim 1, wherein the patterned template layer is formed from a photosensitive composition.

4. The method according to claim 1, further comprising separating the developed photosensitive composition layer from the film.

5. The method according to claim 1, wherein the patterned template layer is on a substrate, and the exposed laminate comprising the photosensitive composition layer, the adhesive layer, and the film is separated from the patterned template layer and the substrate.

6. The method according to claim 1, wherein the photosensitive composition layer comprises a negative-type photosensitive composition, and unexposed areas of the exposure are removed by the development while exposed areas are the fibers.

7. The method according to claim 1, wherein the photosensitive composition layer comprises a positive-type photosensitive composition, and exposed areas of the exposure are removed by the development while unexposed areas are the fibers.

8. The method according to claim 1, wherein the photosensitive composition layer is formed by applying a liquid photosensitive composition onto the patterned template layer.

9. The method according to claim 1, further comprising forming the patterned template layer by a method selected from the group consisting of methods (a) to (e) below:
  (a) applying the photosensitive composition onto the substrate to form a coating film that is processed by photolithography to obtain the patterned template layer;
  (b) applying the photosensitive composition onto the substrate to form a coating film, pressing a pressing mold having a shape corresponding to a pattern shape of the patterned template layer against the coating film, followed by exposing the coating film pressed by the pressing mold to light to cure the coating film to obtain the patterned template layer;
  (c) forming a thin film of a material having a glass transition temperature on the substrate, pressing a pressing mold having a shape corresponding to a pattern shape of the patterned template layer against the thin film in such a state that the formed thin film has been heated at or above the glass transition temperature, thereby deforming the thin film, followed by cooling the deformed thin film to obtain the patterned template layer;
  (d) forming an etching mask having a shape corresponding to a pattern shape of the patterned template layer on the substrate, followed by engraving a pattern on a surface of the substrate by etching to obtain the substrate having a patterned surface as the template layer; and
  (e) forming a thin film of a block copolymer composed of at least two block chains different from each other in surface free energy on the substrate, and obtaining the patterned template layer by self-organizing lithography in which the block copolymer is subjected to microphase separation.

* * * * *